(12) United States Patent
Spencer et al.

(10) Patent No.: US 8,242,564 B2
(45) Date of Patent: Aug. 14, 2012

(54) SEMICONDUCTOR DEVICE WITH PHOTONICS

(75) Inventors: Gregory S. Spencer, Pflugerville, TX (US); Jill C. Hildreth, Austin, TX (US); Robert E. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/313,806

(22) Filed: Dec. 7, 2011

(65) Prior Publication Data

US 2012/0080730 A1      Apr. 5, 2012

Related U.S. Application Data

(62) Division of application No. 12/433,431, filed on Apr. 30, 2009, now Pat. No. 8,093,084.

(51) Int. Cl.
*H01L 27/12* (2006.01)

(52) U.S. Cl. ........ 257/351; 257/347; 257/623; 257/627; 257/E27.111; 438/48; 438/65; 438/221; 438/296

(58) Field of Classification Search .................. 257/351, 257/347, 623, 627, E27.111, E29.283, E21, 257/703; 438/48, 65, 221, 296, 32, 424
See application file for complete search history.

(56) References Cited

U.S. PATENT DOCUMENTS

| | | | |
|---|---|---|---|
| 6,815,278 B1 | 11/2004 | Leong et al. | |
| 7,023,055 B2 | 4/2006 | Leong et al. | |
| 7,023,057 B2 | 4/2006 | Leong et al. | |
| 7,034,362 B2 | 4/2006 | Rim | |
| 7,067,342 B2 | 6/2006 | Zia et al. | |
| 7,085,443 B1 | 8/2006 | Gunn, III et al. | |
| 7,098,090 B2 | 8/2006 | Zia et al. | |
| 7,116,853 B2 | 10/2006 | Gunn, III et al. | |
| 7,205,587 B2 | 4/2007 | Fujimaki | |
| 7,285,455 B2 | 10/2007 | Fujimaki | |
| 7,378,306 B2 | 5/2008 | Spencer et al. | |
| 7,393,732 B2 | 7/2008 | Rim | |
| 2005/0093077 A1 | 5/2005 | Leong et al. | |
| 2005/0093104 A1 | 5/2005 | Leong et al. | |
| 2005/0236687 A1 | 10/2005 | Chan et al. | |
| 2006/0073646 A1 | 4/2006 | Yang | |
| 2006/0194384 A1 | 8/2006 | Venkatesan et al. | |
| 2007/0218654 A1 | 9/2007 | Spencer et al. | |
| 2008/0268587 A1 | 10/2008 | Sadaka et al. | |
| 2008/0274595 A1 | 11/2008 | Spencer et al. | |

OTHER PUBLICATIONS

Soref et al; "Large Single-Mode Rib Waveguides in GeSi-Si and Si-on-SiO2", IEEE Journal of Quantum Electronics, vol. 27, No. 8, Aug. 1991.

*Primary Examiner* — Telly Green
(74) *Attorney, Agent, or Firm* — James L. Clingan, Jr.; Joanna G. Chiu (57) ABSTRACT

A semiconductor structure having a transistor region and an optical device region includes a transistor in a first semiconductor layer of the semiconductor structure, wherein the first semiconductor layer is over a first insulating layer, the first insulating layer is over a second semiconductor layer, and the second semiconductor layer is over a second insulating layer. A gate dielectric of the transistor is in physical contact with a top surface of the first semiconductor layer, and the transistor is formed in the transistor region of the semiconductor structure. A waveguide device in the optical device region and a third semiconductor layer over a portion of the second semiconductor layer.

20 Claims, 8 Drawing Sheets

SEMICONDUCTOR DEVICE WITH PHOTONICS

BACKGROUND

1. Field

This disclosure relates generally to semiconductor devices, and more specifically, to semiconductor devices that include a photodevice.

2. Related Art

Use of photonics in which photodevices are combined with non-photodevices, such as transistors, in the same integrated is becoming more popular. Use of photodevices has become popular in audio applications and has the potential for use in other higher speed systems, especially ones where interference may be high. Due to the different technologies required for photodevices as compared to non-photodevices, generally compromises are required in order to place both types of devices on the same integrated circuit. Dimensions of the various features on both types of devices are very important for performance. Also, it is desirable to occupy as little space as possible for the devices. Thus performance and efficient use of space are both important. Additionally, process complexity is important. It is preferably to not have to have completely separate processes for the two types of devices.

Thus there is a need for an integrated circuit that has both a transistor and a photodevice that improves upon or overcomes one or more of the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a semiconductor structure includes a transistor formed in a transistor portion of a substrate and a photodevice in a photo portion of the substrate which are separated by an isolation region The transistor portion has a first semiconductor layer on a first insulating layer, a second insulating layer on the first semiconductor layer, a second semiconductor layer on the second insulating layer, wherein the source and drain are formed in the second semiconductor layer and the gate is over the second semiconductor layer. The photo portion has a continuous semiconductor region that has a bottom surface on the first insulating layer and a top surface having a planar first portion and a planar second portion wherein the planar second portion is higher than the planar first portion. This is an advantageous structure for both performance and manufacturability. For example, the planar second portion can be substantially coplanar with the top surface of the second semiconductor layer with the aid of epitaxially growing a semiconductor layer that is part of the resulting continuous semiconductor region. This is better understood by reference to the following description and the drawings.

Figure 1:
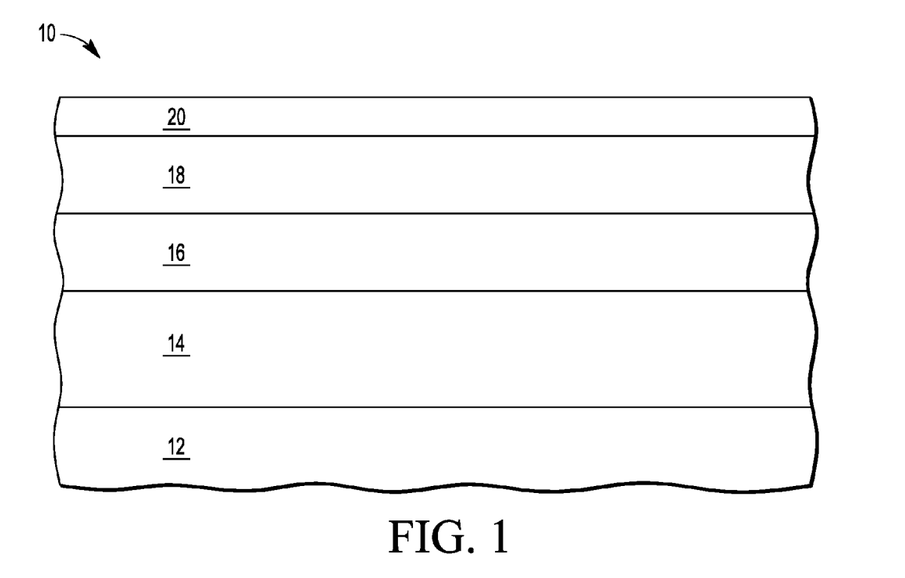
FIG. 1 is a cross section of a semiconductor structure at a stage in processing according to a first embodiment.

Shown in FIG. 1 is a semiconductor structure 10 comprising a semiconductor substrate 12, an insulating layer 14 on semiconductor substrate 12, a semiconductor layer 16 on insulating layer 14, an insulating layer 18 on semiconductor layer 16, and a semiconductor layer 20 on insulating layer 18. Semiconductor structure 10 is a double semiconductor-on-insulator (SOI) structure that is useful in optimizing both N and P channel transistors. In addition in this case semiconductor structure 10 is also chosen to be useful for a photodevice. Semiconductor substrate 12 and semiconductor layers 16 and 20 may be monocrystalline silicon which is the material commonly used for both transistors and photodevices. The thicknesses of semiconductor layers 20 and 18 are selected for use in forming a transistor. The thickness of semiconductor layer 16 and the thickness of insulating layer 14 are selected for convenient manufacture of a photodevice. Insulating layers 14 and 18 may be oxide.

Figure 2:
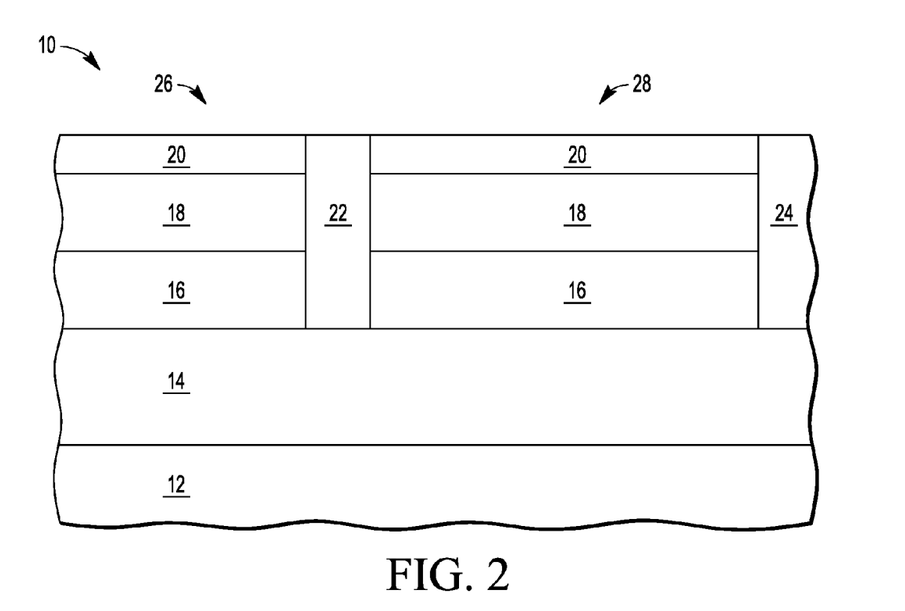
FIG. 2 is a cross section of the semiconductor structure of FIG. 1 at a subsequent stage in processing.

Shown in FIG. 2 is semiconductor structure 10 after forming a trench isolation region 22 and a trench isolation region 24 that extends from the surface of semiconductor layer 20 to insulating layer 14. A portion of semiconductor structure 10 between trench isolation regions 22 and 24 is a photodevice region 28. The other portion shown in FIG. 2 that is adjacent to trench isolation region 22 opposite from photodevice region 28 is a transistor region 26.

Figure 3:
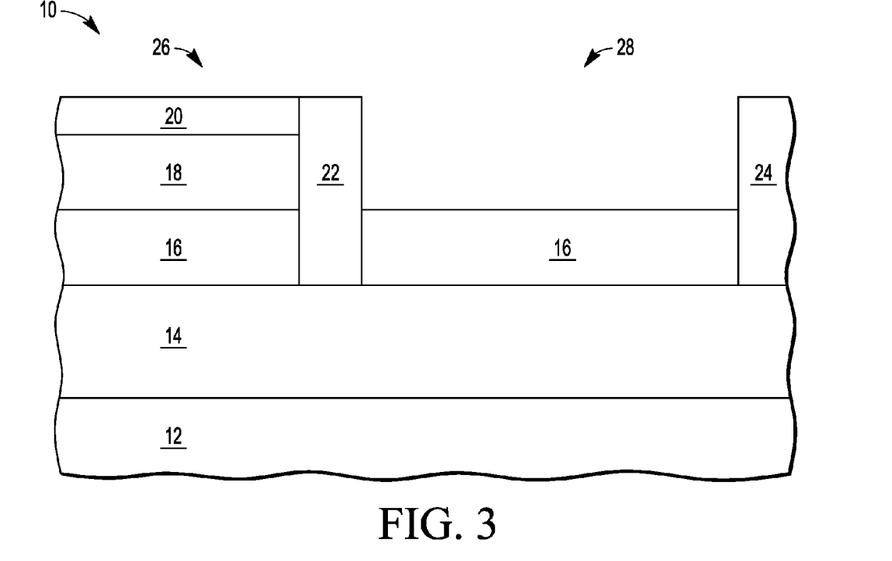
FIG. 3 is a cross section of the semiconductor structure of FIG. 2 at a subsequent stage in processing.

Shown in FIG. 3 is semiconductor structure 10 after removing semiconductor layer 20 and insulating layer 18 in photodevice region 28. This leaves only the top surface of semiconductor layer 16 exposed in photodevice region 28.

Figure 4:
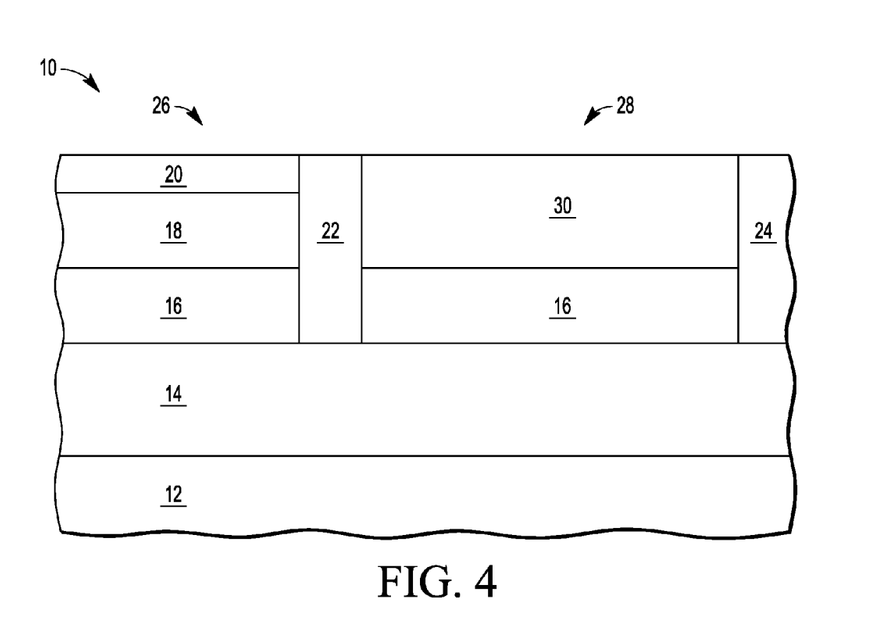
FIG. 4 is a cross section of the semiconductor structure of FIG. 3 at a subsequent stage in processing.

Shown in FIG. 4 is semiconductor structure 10 after epitaxially growing a semiconductor layer 30 over semiconductor layer 16. This may require planarizing to leave the top surface of semiconductor layer 30 coplanar with the top surface of semiconductor layer 20. Semiconductor layer 30 may be monocrystalline silicon.

Figure 5:
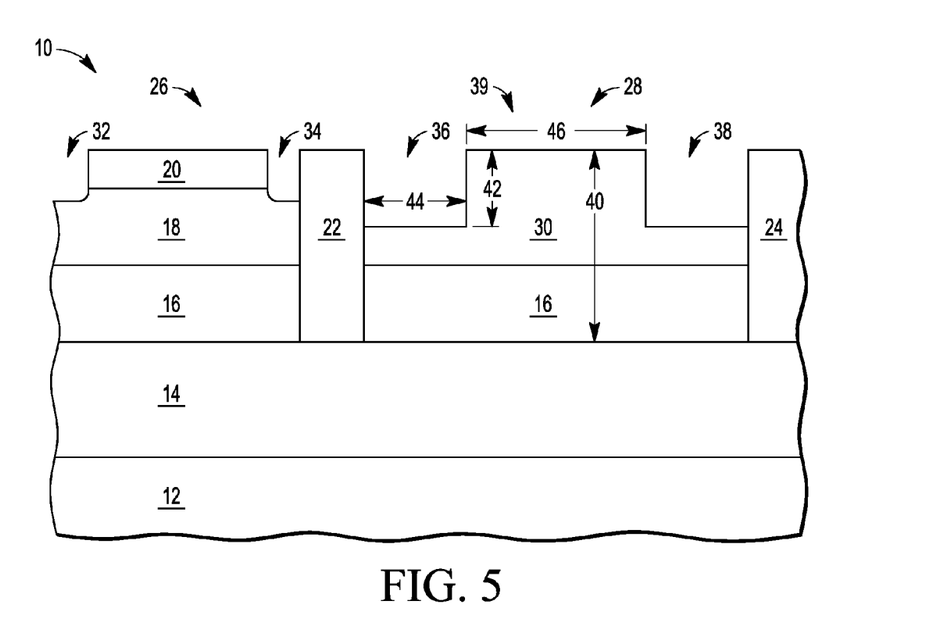
FIG. 5 is a cross section of the semiconductor structure of FIG. 4 at a subsequent stage in processing.

Shown in FIG. 5 is semiconductor structure 10 after performing a patterned silicon etch that removes portions of semiconductor layer 20 and semiconductor layer 30 to form a waveguide 39. The etch leaves openings 32 and 34 in semiconductor layer 20 that extend slightly into insulating layer 18 due to a substantial over etch. Opening 32 is on one side of transistor region 26 and opening 34 is adjacent to trench isolation region 22 on the side of transistor region 26. The over etch is required to achieve openings 36 and 38 in semiconductor layer 30. Openings 36 and 38 are dimensionally the same or at least the same within the processing tolerance. Opening 36 has a width 44 and a height 42. The width of the center portion of the silicon of photodevice region 28 is a width 46, and the height of the silicon in the center portion of photodevice region 28 is a height 40. The center portion of waveguide 39 may also be called the inner rib of waveguide 39 and its width 46 called the rib width. Height 40 is the inner rib height. Height 40 is the sum of the thickness of semiconductor layer 30 and the thickness of semiconductor layer 16. An outer rib is the combination of semiconductor layer 16 plus the remaining unetched portion of semiconductor layer 30 extending from the inner rib. An outer rib height is height 40 minus height 42. Height 42 is the etch depth resulting from the etch shown in FIG. 5. Width 44 in this example is shown to be a dimension that would be at or near a minimum dimension and called also a wing length 44. As an alternative, width 44 can be much larger and have a vertical portion that extends to the same height as height 40. This vertical portion may then be used as a contact or some other purpose. Although the dimensions are critical for performance, those dimensions are highly dependent upon the particular application. Thus, for example, the wavelength of the light being carried is very important as is the index of refraction of the semiconductor material being used. The considerations for optimizing the dimensions for a waveguide are known to one of ordinary skill in the art.

Figure 6:
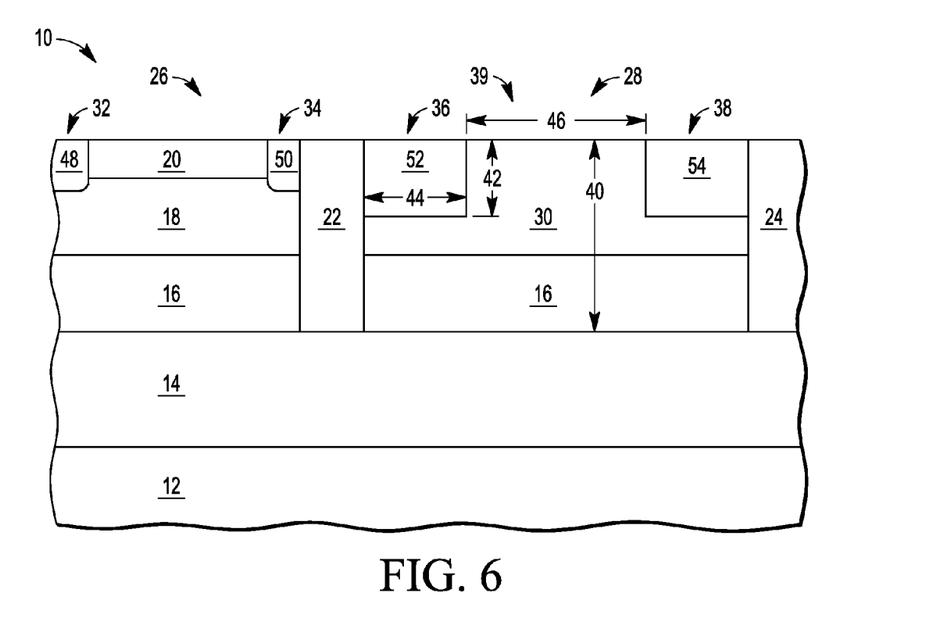
FIG. 6 is a cross section of the semiconductor structure of FIG. 5 at a subsequent stage in processing.

Shown in FIG. 6 is semiconductor structure 10 after depositing oxide to fill openings 32, 34, 36, and 38 and planarizing. The result is filled opening 32 being an isolation region 48. Filled opening 34 becomes insulation region 50, filled opening 36 becoming insulation region 52, and filled opening 38 becoming insulation region 54. Opening 34 and consequent insulation region 50 may not be necessary because trench isolation region 22 may be sufficient for the needed isolation.

Figure 7:
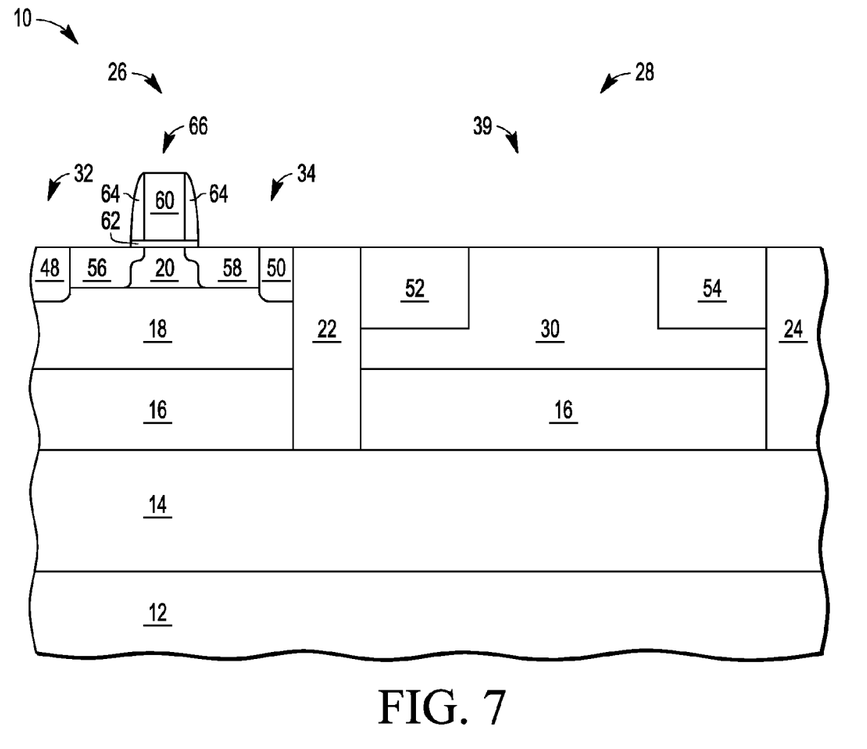
FIG. 7 is a cross section of the semiconductor structure of FIG. 6 at a subsequent stage in processing.

Shown in FIG. 7 is semiconductor structure 10 after forming a source/drain 56 in semiconductor layer 20, a source/drain 58, a gate 60 over a gate dielectric 62, and a sidewall spacer 64 around gate 60 to form a transistor 66.

Figure 8:
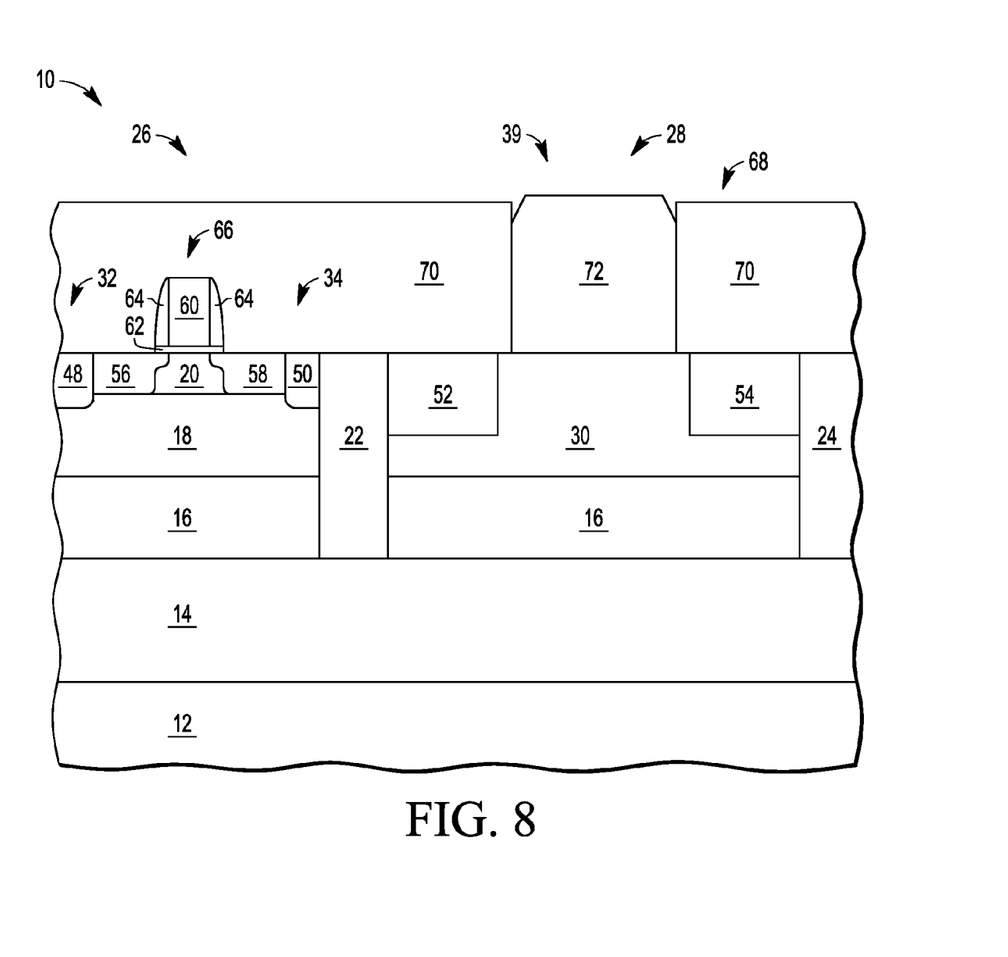
FIG. 8 is a cross section of the semiconductor structure of FIG. 7 at a subsequent stage in processing.

Shown in FIG. 8 is semiconductor structure 10 with a germanium layer 72 epitaxially grown on the rib of waveguide 39 using an insulating layer 70 as a guide for the epitaxial growth. This results in waveguide 39 becoming a photo detector or termination. The epitaxial growth is selective as growing only on exposed silicon.

Figure 9:
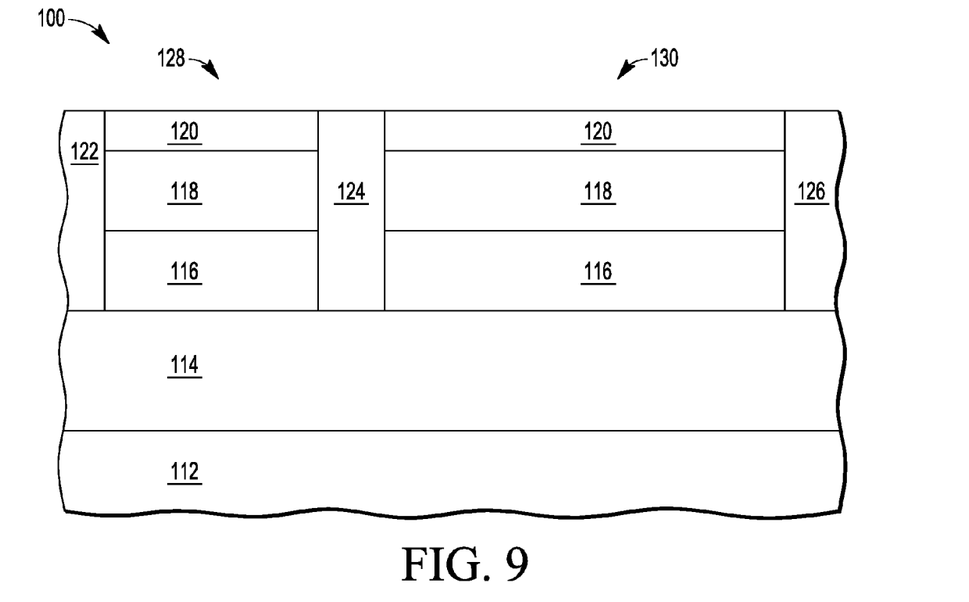
FIG. 9 is a cross section of a semiconductor structure at a stage in processing according to a second embodiment.

Shown in FIG. 9 is a semiconductor structure 100, similar to semiconductor structure 10 of FIGS. 1 and 2, comprising a semiconductor substrate 112, an insulating layer 114 on semiconductor substrate 112, a semiconductor layer 116 on insulating layer 114, an insulating layer 118 on semiconductor layer 116, and a semiconductor layer 120 on insulating layer 118. Semiconductor structure 100 is a double SOI structure that is useful in optimizing both N and P channel transistors. In addition in this case semiconductor structure 100 is also chosen to be useful for a photodevice. Semiconductor substrate 112 and semiconductor layers 116 and 120 may be monocrystalline silicon which is the material commonly used for both transistors and photodevices. The thickness of semiconductor layers 120 and the thickness of insulating layer 118 are selected for use in forming a transistor. The thickness of semiconductor layer 116 and the thickness of insulating layer 114 are selected for convenient manufacture of a photodevice. Insulating layers 114 and 118 may be oxide. Also included are trench isolation regions 122, 124 and 126 that extend from the surface of semiconductor layer 120 to insulating layer 114. Trench isolation region 122 is on one side of semiconductor structure shown in FIG. 9. Trench isolation region 126 is on the other side of semiconductor structure as shown in FIG. 9. Trench isolation region 124 is between trench isolation regions 122 and 126. A portion of semiconductor device 100 between trench isolation regions 124 and 126 is a photodevice region 130. The other portion shown in FIG. 9 that is adjacent to trench isolation region 124 opposite from photodevice region 130 is a transistor region 128 between trench isolation regions 122 and 124.

Figure 10:
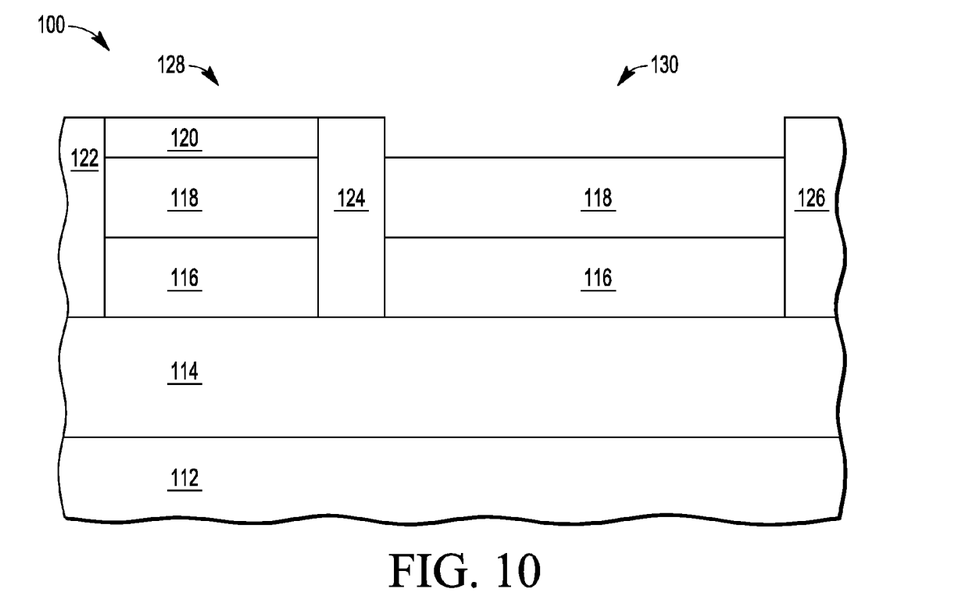
FIG. 10 is a cross section of the semiconductor structure of FIG. 9 at a subsequent stage in processing.

Shown in FIG. 10 is semiconductor structure 100 after removing semiconductor layer 120 in the photodevice region 130.

Figure 11:
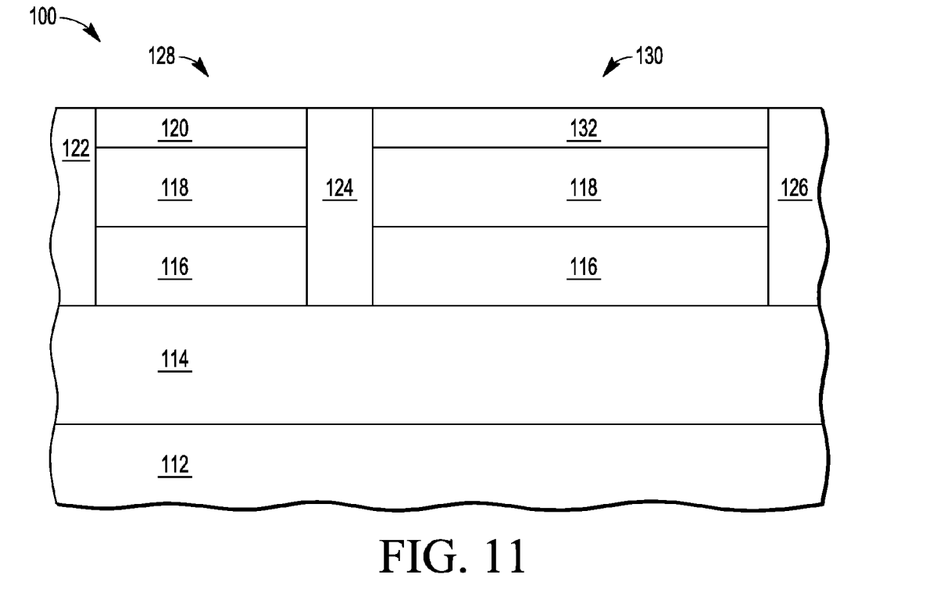
FIG. 11 is a cross section of the semiconductor structure of FIG. 10 at a subsequent stage in processing.

Shown in FIG. 11 is semiconductor structure 100 after depositing an insulating layer 132 over insulating layer 118 in photodevice region 130 and planarizing.

Figure 12:
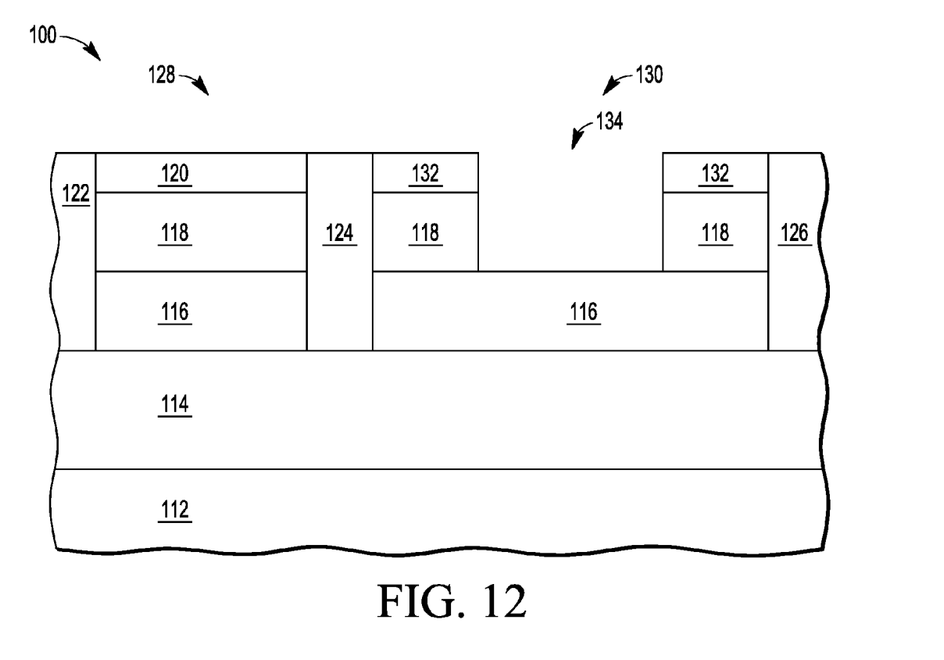
FIG. 12 is a cross section of the semiconductor structure of FIG. 11 at a subsequent stage in processing.

Shown in FIG. 12 is semiconductor structure 100 after forming an opening 134 in insulating layers 132 and 118 of photodevice region 130 to semiconductor layer 116. This is a patterned etch so that an etch for use in forming trench isolation could be performed in this step as well.

Figure 13:
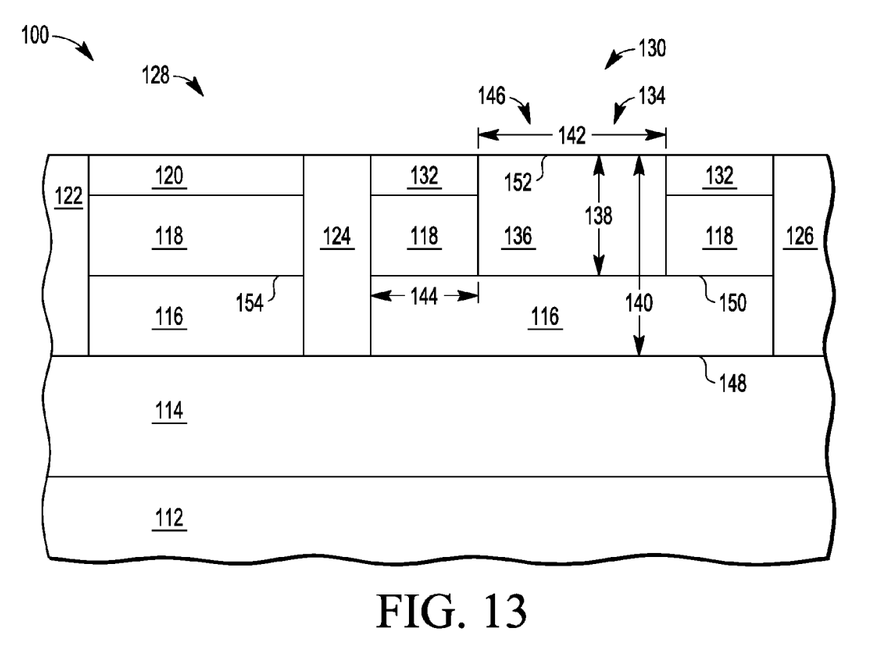
FIG. 13 is a cross section of the semiconductor structure of FIG. 12 at a subsequent stage in processing.

Shown in FIG. 13 is semiconductor structure 100 after epitaxially growing a semiconductor layer 136 and planarizing to form a waveguide 146 having a rib width 142, an inner rib height 140, and an outer rib length 144. A height 138 is the sum of the thicknesses of insulating layers 118 and 132. As in waveguide 39, waveguide 146 has a top surface having a first planar portion and a second planar portion. In the case of waveguide 146, the first planar portion has a surface 150 that is also the top surface of semiconductor layer 116 so that the first planar portion is coplanar with top surface 154 of semiconductor layer 116 of transistor region 128. A transistor, in the same manner as forming transistor 66 in FIG. 8, will be formed in and over semiconductor layer 120. Similarly, waveguide 146 may be used as a photo detector by epitaxially growing a germanium layer on semiconductor layer 136. The approach of achieving waveguide 146 is simpler than that for achieving waveguide 39 by having semiconductor layer 116 in photodevice region 130 used as the wing of waveguide 146. The method for achieving waveguide 146 may not result in optimum performance but it may nonetheless be desirable because of the simplicity in processing and corresponding reduction in cost.

Resulting waveguides 39 and 146 are thus combinable with transistors in the same integrated circuit in a manner that is manufacturable and provides efficient use of space. Also performance can be tuned by providing the desired dimensions or providing a tradeoff between high performance and simplified processing. There are situations where the simplified processing may require little or no performance tradeoff.

By now it should be appreciated that there has been provided a semiconductor structure including a substrate, a first insulating layer over the substrate, a transistor region, and an optical device region. In the transistor region, is a first semiconductor layer over the first insulating layer, a second insulating layer over the first semiconductor layer, a second semiconductor layer over the second insulating layer, and a transistor having a gate dielectric, the gate dielectric over and in physical contact with a top surface of the second semiconductor layer, wherein the first semiconductor layer has a bottom surface and a top surface opposite the bottom surface, and wherein the top surface of the first semiconductor layer is between the bottom surface of the first semiconductor layer and the second insulating layer. In the optical device region is a waveguide device over the first insulating layer, wherein the waveguide device has a bottom surface and a top surface opposite the bottom surface, wherein the bottom surface of the waveguide device is substantially coplanar with the bottom surface of the first semiconductor layer, wherein the top surface of the waveguide device has a first portion and a second portion, the second portion being located higher than the first portion with respect to the bottom surface of the waveguide device, wherein the waveguide device comprises a continuous semiconductor material, and wherein the second portion of the top surface of the waveguide device is substantially coplanar with the top surface of the second semiconductor layer. The first portion of the top surface of the waveguide device may be substantially coplanar with the top surface of the first semiconductor layer. The semiconductor structure may further comprise an isolation region between the transistor region and optical device region, the isolation region extending to the first insulating layer. The semiconductor structure may further comprise a photodetector over and in physical contact with the second portion of the top surface of the waveguide device.

Also described is a method for forming a semiconductor structure having a transistor region and an optical device region. The method includes forming a transistor in and on a first semiconductor layer of the semiconductor structure, wherein the first semiconductor layer is over a first insulating layer, the first insulating layer is over a second semiconductor layer, and the second semiconductor layer is over a second insulating layer, wherein a gate dielectric of the transistor is in physical contact with a top surface of the first semiconductor layer, and wherein the transistor is formed in the transistor region of the semiconductor structure. The method further includes forming a waveguide device in the optical device region of the semiconductor structure. The forming the waveguide device includes exposing a portion of the second semiconductor layer in the optical device region and epitaxially growing a third semiconductor layer over the portion of the second semiconductor layer. The exposing the portion of the second semiconductor layer may include removing portions of the first semiconductor layer and the first insulating layer in the optical device region to expose the portion of the second semiconductor layer. The forming the waveguide device may include, after epitaxially growing the third semiconductor layer, forming an opening in the third semiconductor layer to define a top surface of the waveguide device having a higher portion and a lower portion, wherein the higher portion of the top surface of the waveguide device is higher than the lower portion of the top surface of the waveguide device with respect to the second semiconductor layer. The method may further include filling the opening in the third semiconductor layer with an insulating material. The method may further include forming openings in the first semiconductor layer in the transistor region simultaneously with the forming the opening in the third semiconductor layer, wherein the forming the openings in the first semiconductor layer and the forming the opening in the third semiconductor layer are performed prior to the forming the transistor. The method may further include filling the openings in the first semiconductor layer and the opening in the third semiconductor layer with an insulating material. The epitaxially growing the third semiconductor layer over the portion of the second semiconductor layer may be performed such that a top surface of the third semiconductor layer is substantially coplanar with the top surface of the first semiconductor layer. The method may be further characterized by, prior to the forming the transistor and the forming the waveguide device, the method includes forming an isolation region between the transistor region and the optical device region, wherein the isolation region extends to the second insulating layer. The method may further comprise forming a photodetector over and in physical contact with the waveguide device. The method may be further characterized by, prior to the exposing the portion of the second semiconductor layer, the forming the waveguide device further includes removing the first semiconductor layer in the optical device region, resulting in an opening and filling the opening with a third insulating layer. The method may be further characterized by the exposing the portion of the second semiconductor layer including removing portions of the third insulating layer in the optical device region and the first insulating layer in the optical device region to expose the portion of the second semiconductor layer. The method may further include forming openings in the first semiconductor layer in the transistor region simultaneously with the removing the first semiconductor layer in the optical device region, wherein the forming the openings in the first semiconductor layer is performed prior to the forming the transistor. The method may further comprise filling the openings in the first semiconductor layer with an insulating material. The method may be further characterized by, prior to the exposing the portion of the second semiconductor layer, the forming the waveguide device further includes removing the first semiconductor layer in the optical device region and the first insulating layer in the optical device region, resulting in an opening; and filling the opening with a third insulating layer; wherein the exposing the portion of the second semiconductor layer includes removing portions of the third insulating layer in the optical device region to expose the portion of the second semiconductor layer.

Described also is a method for forming a semiconductor structure having a transistor region and an optical device region. The method includes forming an isolation region between the transistor region and the optical device region. The method further includes forming a transistor in and on a first semiconductor layer of the semiconductor structure, wherein the first semiconductor layer is over a first insulating layer, the first insulating layer is over a second semiconductor layer, and the second semiconductor layer is over a second insulating layer, wherein a gate dielectric of the transistor is in physical contact with a top surface of the first semiconductor layer, wherein the transistor is formed in the transistor region, and wherein the isolation region extends to the second insulating layer. The method further includes forming a waveguide device in the optical device region of the semiconductor structure. Forming the waveguide device includes removing the first semiconductor layer in the optical device region, resulting in an opening; filling the opening with a third insulating layer; removing portions of the third insulating layer in the optical device region and the first insulating layer in the optical device region to expose a portion of the second semiconductor layer; and epitaxially growing a third semiconductor layer over the portion of the second semiconductor layer. The method may be further characterized by the epitaxially growing the third semiconductor layer over the portion of the second semiconductor layer being performed such that a top surface of the third semiconductor layer is substantially coplanar with the top surface of the first semiconductor layer.

Although the invention is described herein with reference to specific embodiments, various modifications and changes can be made without departing from the scope of the present invention as set forth in the claims below. For example, the waveguides shown suggest a straight line transmission waveguide, but waveguides 10 and 100 have structures that can be used in a variety of waveguide type devices such as tapered waveguides, grating couplers, interferometers, waveguide to waveguide couplers, and ring resonators. Also these may include multiple alternating inner ribs and outer ribs. These different possible uses will have their own optimum dimensions. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor structure, comprising:
    a substrate;
    a first insulating layer over the substrate;
    in a transistor region, a first semiconductor layer over the first insulating layer, a second insulating layer over the first semiconductor layer, a second semiconductor layer over the second insulating layer, and a transistor having a gate dielectric, the gate dielectric over and in physical contact with a top surface of the second semiconductor layer, wherein the first semiconductor layer has a bottom surface and a top surface opposite the bottom surface, and wherein the top surface of the first semiconductor layer is between the bottom surface of the first semiconductor layer and the second insulating layer; and
    in an optical device region, a waveguide device over the first insulating layer, wherein the waveguide device has a bottom surface and a top surface opposite the bottom surface, wherein the bottom surface of the waveguide device is substantially coplanar with the bottom surface of the first semiconductor layer, wherein the top surface of the waveguide device has a first portion and a second portion, the second portion being located higher than the first portion with respect to the bottom surface of the waveguide device, wherein the waveguide device comprises a continuous semiconductor material, wherein the second portion of the top surface of the waveguide device is substantially coplanar with the top surface of the second semiconductor layer, and wherein the continuous semiconductor material is epitaxially grown on the second portion.

2. The semiconductor structure of claim 1, wherein the first portion of the top surface of the waveguide device is substantially coplanar with the top surface of the first semiconductor layer.

3. The semiconductor structure of claim 1, further comprising an isolation region between the transistor region and optical device region, the isolation region extending to the first insulating layer.

4. The semiconductor structure of claim 1, further comprising a photodetector over and in physical contact with the second portion of the top surface of the waveguide device.

5. A semiconductor structure having a transistor region and an optical device region, comprising:
    a transistor in and on a first semiconductor layer of the semiconductor structure, wherein the first semiconductor layer is over a first insulating layer, the first insulating layer is over a second semiconductor layer, and the second semiconductor layer is over a second insulating layer, wherein a gate dielectric of the transistor is in physical contact with a top surface of the first semiconductor layer, and wherein the transistor is formed in the transistor region of the semiconductor structure; and
    a waveguide device in the optical device region of the semiconductor structure, wherein the waveguide device includes a third semiconductor layer epitaxially grown over a portion of the second semiconductor layer in the optical device region.

6. The structure of claim 5, wherein portions of the first semiconductor layer and the first insulating layer are removed in the optical device region over the portion of the second semiconductor layer.

7. The structure of claim 6, wherein the waveguide device further comprises:
    an opening in the third semiconductor layer that defines a top surface of the waveguide device having a higher portion and a lower portion, wherein the higher portion of the top surface of the waveguide device is higher than the lower portion of the top surface of the waveguide device with respect to the second semiconductor layer.

8. The structure of claim 7, further comprising:
    the opening in the third semiconductor layer is filled with an insulating material.

9. The structure of claim 7, further comprising:
    openings in the first semiconductor layer in the transistor region, wherein the openings are formed prior to forming the transistor.

10. The structure of claim 9, further comprising:
    the openings in the first semiconductor layer and the opening in the third semiconductor layer are filled with an insulating material.

11. The structure of claim 5, wherein a top surface of the third semiconductor layer is substantially coplanar with the top surface of the first semiconductor layer.

12. The structure of claim 5, further comprising:
    an isolation region formed between the transistor region and the optical device region, wherein the isolation region extends to the second insulating layer.

13. The structure of claim 5, further comprising:
    a photodetector formed over and in physical contact with the waveguide device.

14. The structure of claim 5, further comprising:
    an opening in the optical device region filled with a third insulating layer.

15. The structure of claim 14, wherein:
    portions of the third insulating layer in the optical device region and the first insulating layer in the optical device region are removed to expose the portion of the second semiconductor layer.

16. The structure of claim 14, further comprising:
    openings formed in the first semiconductor layer in the transistor region and the first semiconductor layer is removed in the optical device region.

17. The structure of claim 16, further comprising:
    the openings in the first semiconductor layer are filled with an insulating material.

18. The structure of claim 5, wherein, prior to the exposing the portion of the second semiconductor layer, the forming the waveguide device further comprises:
    removing the first semiconductor layer in the optical device region and the first insulating layer in the optical device region, resulting in an opening; and
    filling the opening with a third insulating layer;
    wherein the exposing the portion of the second semiconductor layer comprises:

removing portions of the third insulating layer in the optical device region to expose the portion of the second semiconductor layer.

19. A semiconductor structure having a transistor region and an optical device region, comprising:
   an isolation region between the transistor region and the optical device region;
   a transistor in and on a first semiconductor layer of the semiconductor structure, wherein the first semiconductor layer is over a first insulating layer, the first insulating layer is over a second semiconductor layer, and the second semiconductor layer is over a second insulating layer, wherein a gate dielectric of the transistor is in physical contact with a top surface of the first semiconductor layer, wherein the transistor is formed in the transistor region, and wherein the isolation region extends to the second insulating layer; and
   a waveguide device in the optical device region of the semiconductor structure, wherein the waveguide device comprises:
      an opening in the first semiconductor layer in the optical device region;
      a third insulating layer filling the opening in the first semiconductor layer; and
      a third semiconductor layer over the portion of the second semiconductor layer.

20. The structure of claim 19, wherein a top surface of the third semiconductor layer is substantially coplanar with the top surface of the first semiconductor layer.

* * * * *